US009664736B2

(12) United States Patent
Seah et al.

(10) Patent No.: US 9,664,736 B2
(45) Date of Patent: May 30, 2017

(54) MULTIPLE RATE SIGNATURE TEST TO VERIFY INTEGRATED CIRCUIT IDENTITY

(71) Applicant: Texas Instruments Incorporated, Dallas, TX (US)

(72) Inventors: Soh Ying Seah, Negeri Sembilan (MY); Gunvant Patel, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 76 days.

(21) Appl. No.: 14/262,778

(22) Filed: Apr. 27, 2014

(65) Prior Publication Data

US 2015/0309111 A1    Oct. 29, 2015

(51) Int. Cl.
*G06F 11/263*     (2006.01)
*G01R 31/317*     (2006.01)
*G01R 31/319*     (2006.01)

(52) U.S. Cl.
CPC . *G01R 31/31718* (2013.01); *G01R 31/31919* (2013.01)

(58) Field of Classification Search
CPC ........ G01R 31/31813; G01R 31/31919; G01R 31/318307; G01R 31/31908; G01R 31/31917; G01R 31/318566; G01R 31/318541; G01R 31/2834; G01R 31/31915; G01R 31/3167; G01R 31/318533; G01R 31/31835; G11C 29/56; G11C 2029/3202; G11C 29/56004; G11C 29/10; G06F 11/2236; G06F 11/263; G06F 11/273; G06F 2201/83; H04L 43/50
USPC .......................................................... 324/750
See application file for complete search history.

(56) References Cited

U.S. PATENT DOCUMENTS

| | | | | |
|---|---|---|---|---|
| 5,644,102 A | * | 7/1997 | Rostoker | H01L 23/544 174/547 |
| 5,818,250 A | * | 10/1998 | Yeung | G01R 31/30 324/762.02 |
| 6,574,760 B1 | * | 6/2003 | Mydill | G01R 31/287 324/762.02 |
| 6,683,470 B2 | * | 1/2004 | Takeuchi | G11C 29/56 324/762.01 |
| 8,418,011 B2 | * | 4/2013 | Goishi | G01R 31/31813 708/250 |
| 2002/0199142 A1 | * | 12/2002 | Gefen | G01R 31/319 714/724 |
| 2003/0217341 A1 | * | 11/2003 | Rajsuman | G01R 31/31813 324/750.01 |

(Continued)

*Primary Examiner* — Son Le
*Assistant Examiner* — Akm Zakaria
(74) *Attorney, Agent, or Firm* — Tuenlap D. Chan; Charles A. Brill; Frank D. Cimino (57) ABSTRACT

Screening a batch of integrated circuits (IC) may be done with test patterns provided in a sequence of test vectors. The sequence of test vectors may be fetched from a memory coupled to a tester and then one or more bits from each test vector may be provided to the tester. A test pattern is formed by updating a latch in a periodic manner with a bit value from a same bit position from each of the sequence of test vectors. The test pattern may then be applied to an input pin of a device under test and a resulting signal may be monitored on an output pin of each one of the batch of ICs. A slow speed ICs may be screened by treating each IC that passes both a fast pattern test and a slow speed pattern test as a failure, for example.

8 Claims, 9 Drawing Sheets

(56) References Cited

U.S. PATENT DOCUMENTS

| | | | |
|---|---|---|---|
| 2006/0190794 A1* | 8/2006 | Murata | G01R 31/31924 714/742 |
| 2007/0061640 A1* | 3/2007 | Arkin | G01R 31/31926 714/724 |
| 2007/0245186 A1* | 10/2007 | Abe | G01R 31/31715 714/724 |
| 2008/0030217 A1* | 2/2008 | Patel | G01R 31/31924 324/759.01 |
| 2010/0017042 A1* | 1/2010 | Lopata | G06F 1/3203 700/286 |

* cited by examiner

MULTIPLE RATE SIGNATURE TEST TO VERIFY INTEGRATED CIRCUIT IDENTITY

FIELD OF THE INVENTION

This invention generally relates to fabrication and test of integrated circuits, and in particular to verification of correctly packaged chips.

BACKGROUND OF THE INVENTION

A conventional semiconductor (e.g., silicon) wafer contains a plurality of integrated circuit die, also referred to as chips. Conventional assembly processes such as pick and place use an electronic wafer map that includes information indicative of die attributes such as the exact location of each die on the wafer, and wafer-level probe test results for each die. The wafer map identifies the exact location of each die using a coordinate system that corresponds to the physical structure of the wafer. The probe test results (die quality) may be expressed as a single bit value, e.g., good (accept) or bad (reject), or a multiple bit value that provides additional information such as good first grade, good second grade, etc. The wafer map may include a plurality of bin numbers to categorize various attributes and/or properties of each die. For example, bin 1 may contain identification of all good first grade dice, bin 2 may contain identification of all good second grade dice, bin 3 may contain identification of all plug dice, bin 4 may contain identification of all bad dice, and bin 5 may contain identification of all edge bad dice. Each die may be assigned to a particular bin based on the results of the probe testing.

A wafer map host system receives the map data, provides storage, and enables data download into the production equipment to support processing of wafers to manufacture a semiconductor product. The wafer map host system transforms the lot's wafer map file into a suitable map file for the pick and place equipment to handle and prepares them for equipment download. On the manufacturing floor, as the wafer goes through the assembly process, a barcode may be generated for the wafer identification (ID) and may be attached to the wafer or to a carrier frame. When the wafer is ready to be processed at the pick and place equipment, the frame or wafer ID barcode is scanned and is used to request the wafer map from the wafer map host system. The pick and place equipment uses the downloaded wafer map to directly step to the good chips for pick-up.

At an Assembly/Test (A/T) facility, a wafer undergoes sawing to singulate the dice, and pick and place processing based on the wafer map. A wafer map, which specifies the exact location of all good dice, is used to control an accept/reject function of a typical pick and place system. The Die Attach assembly process depends on automated equipment following a wafer map perfectly to attach only Good Electrical Chips (GEC) to lead frames. Alignment typically happens only at the start of each wafer. Any error that occurs after alignment is complete is generally undetectable and may allow bad die to be mounted on lead frames.

BRIEF DESCRIPTION OF THE DRAWINGS

Particular embodiments in accordance with the invention will now be described, by way of example only, and with reference to the accompanying drawings.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The speed of operation of integrated circuits is typically determined by multiple factors, such as: operating voltage, transistor technology, process variations during wafer manufacture, etc., for example. In some cases, devices may be sorted based on what speed they can operate correctly, in which case faster parts may be sold at a premium price over slow parts.

For some devices, a family of parts may be designed that intentionally operate with different speed parameters. For example, communication transmitter and receiver buffers may be designed to have rise and fall times, propagation times, etc., for example, that are tailored for particular communication standards or operation frequencies. In this case, one set of wafers may be processed in such a manner that "slow" parts are produced. Another set of wafers may be processed in such a manner that "fast" parts are produced. The difference may be a strictly a result of processing, or there may be a difference in one or more masks to produce slightly different transistors, resistors, or other components that affect speed performance, for example. In some cases, a wafer may be designed to produce two or more speed parts by appropriate design of the masks used to process the wafer.

Regardless of how the various speed devices are produced, they eventually get encapsulated and then labeled to identify which speed member of the family they are. However, occasionally finished devices may be incorrectly labeled. This may be due to combining assembly/test lots or combining wafers at the die pick process, for example.

A simple method to screen a batch of parts to verify that they are correctly labeled will be described herein. The method performs signal rate checking by executing digital pattern tests at various speeds using direct memory access (DMA) to a sequence of test vectors stored in a memory that is coupled to a tester. One or more bits from each word is provided to the tester which then forms a test pattern by updating a latch in a periodic manner with a bit value from a same bit position from each of the sequence of test vectors. The test pattern is then applied to an input pin and a resulting signal is monitored on an output pin of each one of the batch of ICs. By applying several different speed patterns and monitoring the output signal from the IC, the speed of each IC in the batch may be determined.

For the purpose of describing the test method, an example family of parts available from Texas Instruments Incorporated™ will now be briefly described. These devices are half-duplex transceivers designed for RS-485 data bus networks. Powered by a 5-V supply, they are fully compliant with TIA/EIA-485A standard. With controlled transition times, these devices are suitable for transmitting data over long twisted-pair cables. SN65HVD3082E devices are optimized for signaling rates up to 200 kbps. SN65HVD3085E is suitable for data transmission up to 1 Mbps, whereas SN65HVD3088E is suitable for applications requiring signaling rates up to 20 Mbps. These devices are designed to operate with very low supply current, typically 0.3 mA, exclusive of the load. When in the inactive shutdown mode, the supply current drops to a few nanoamps, making these devices ideal for power-sensitive applications. While this family of parts will be used to explain the principles of embodiments of the invention, other families of parts may be screened using the principles described herein.

Table 1 summarizes a relevant speed parameter, signaling rate, that may be used to screen a batch of devices in the transceiver family described herein. While signaling rate is discussed herein, other speed parameters may be useful for screening devices using the principles described herein, such as propagation time as illustrated in Table 2, voltage/current measurements, etc., for example.

TABLE 1 example test parameters for different speed devices

| temperature | Signaling Rate (Mbps) | device |
|---|---|---|
| −40° C. to 85° C. | 0.2 | (slow) XXXXX-2 |
| | 1 | (mid) XXXXX-5 |
| | 20 | (fast) XXXXX-8 |

TABLE 2 example test parameters for different speed devices

| parameter | Test conditions | device | MIN | TYP | MAX | unit |
|---|---|---|---|---|---|---|
| Propagation delay time, low-to-high and hi-to-low output | Rload = 50 Ω Cload = 50 pf | (slow) XXXXX-2 | | 700 | 1300 | ns |
| | | (mid) XXXXX-5 | | 150 | 500 | |
| | | (fast) XXXXX-8 | | 12 | 20 | |

Figure 1:
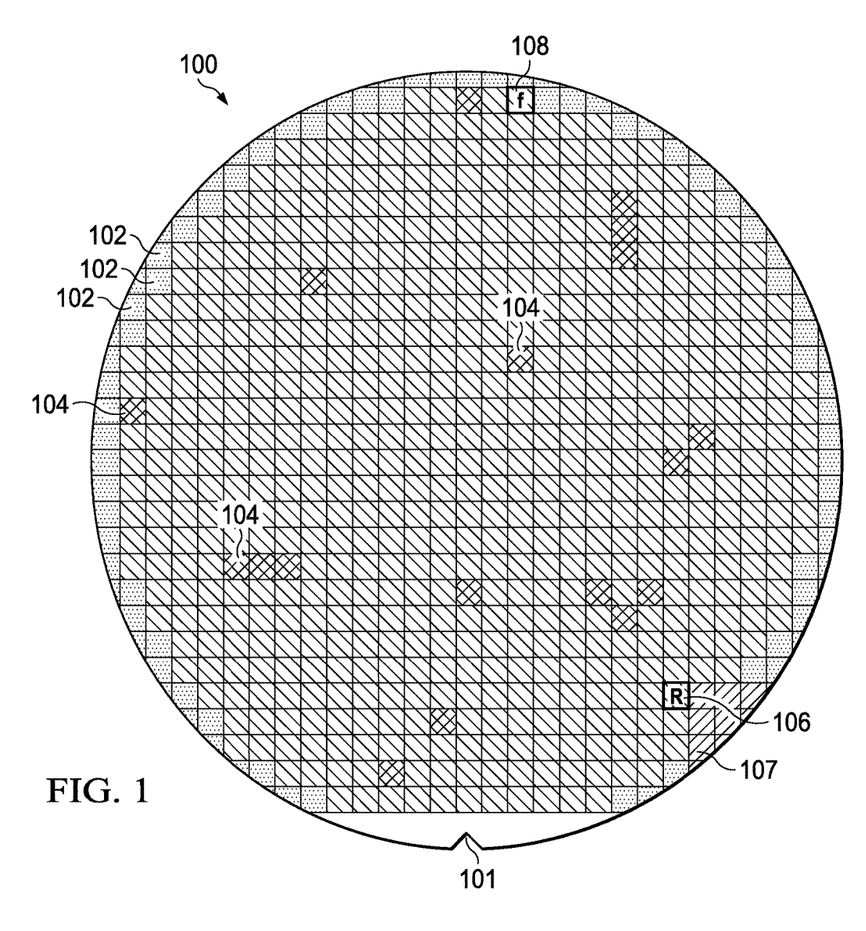
FIG. 1 illustrates an example semiconductor wafer.

FIG. 1 shows an example of a typical semiconductor wafer, where the constituent dice are illustrated as adjacent rectangular shapes in a two-dimensional array of the wafer, but are not shown to actual scale. Larger wafers that are now available may contain hundreds or thousands of die, depending on the size of the die and the size of the wafer. For example, a typical wafer may range in size from a few inches in diameter to twelve inches (300 mm) or more in diameter. A wafer typically contains an orientation marker 101 in the form of a wafer notch. Other examples of orientation markers include a wafer flat, a wafer notch, or similar feature.

A suitable reference feature, e.g., a mirror area, non-circuit die, or other feature that is readily distinguishable visually from an integrated circuit die, may be located in a predetermined area of the wafer. In the example of FIG. 1, the reference feature is a mirror die area 107 that occupies an area adjacent a lower right edge of the wafer, close to the flat edge orientation marker. A reference die 106 is located leftward adjacent the mirror die area 107 as shown in the FIG. 1. A coordinate system of the wafer map is defined relative to the location of the reference die on the wafer. The spatial relationship between the reference die and the reference feature is known. The reference feature is readily identifiable by its visually distinct appearance and its known spatial relationship to the wafer notch orientation marker. In conventional full wafer processing, the probe station and assembly/test (ATE) facility equipment uses the reference feature to identify the reference die.

Around the edge of wafer 100 are edge die 102 that are not usable and will be discarded. There may also be a number of die that were determined to be defective by the wafer probe process. In this example wafer a set of defective die are shown as shaded blocks, as indicated generally at 104. The die map generated during wafer probe contains the location of all defective and edge die. Obviously, the location of the defective die may be different on each wafer.

Conventional assembly processes such as pick and place use an electronic wafer map that includes information indicative of die attributes such as the exact location of each die on the wafer, and wafer-level probe test results for each die. The wafer map identifies the exact location of each die using a coordinate system that corresponds to the physical structure of the wafer. The wafer map includes a plurality of bin numbers to categorize various attributes and/or properties of each die In this example, the probe test results (die quality) may be expressed as a bin value in which bin 1-5 are good (accept) and bin 6-99 are bad (reject). Each die may be assigned to a particular bin based on the results of the probe testing.

A wafer map host system receives the map data, provides storage, and enables data download into the production equipment to support processing of wafers to manufacture a semiconductor product. The wafer map host system transforms the lot's wafer map file into a suitable map file for the pick and place equipment to handle and prepares them for equipment download. On the manufacturing floor, as the wafer goes through the assembly process, a barcode may be generated for the wafer identification (ID) and may be attached to the wafer or to a carrier frame. When the wafer is ready to be processed at the pick and place equipment, the frame or wafer ID barcode is scanned and is used to request the wafer map from the wafer map host system. The pick and place equipment uses the downloaded wafer map to directly step to the good chips for pick-up. In this example, devices marked for bins 1-5 will be picked as good. Bins 6-99 indicate bad devices. In this example, the wafer test does not distinguish on different grades of devices.

At an Assembly/Test (A/T) facility, a wafer undergoes sawing to singulate the dice, and pick and place processing based on the wafer map. The wafer map, which specifies the exact location of all good dice, is used to control an accept/reject function of a typical pick and place system. The Die Attach assembly process depends on automated equipment following a wafer map perfectly to attach only Good Electrical Chips (GEC) to lead frames. After being attached to the lead frame, the devices may be encapsulated using a molding process, for example, and then labeled. The finished devices may them be placed in tubes, attached to a tape that is then wound onto a reel, or placed in a box or other packing scheme for shipment, for example.

Figure 2:
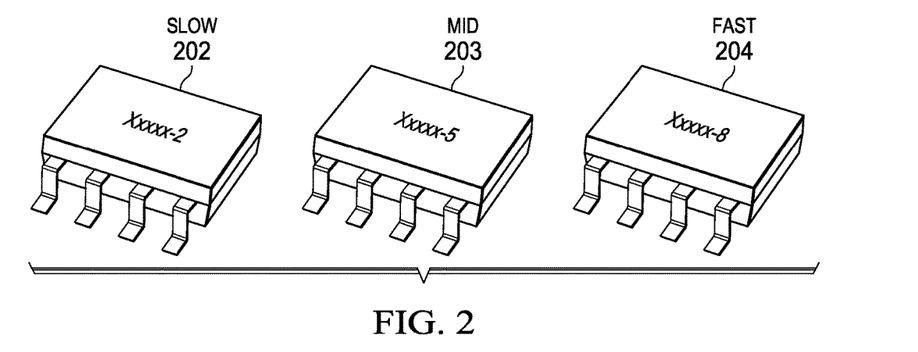
FIG. 2 is an illustration of a family of integrated circuit devices that meet different speed parameters.

FIG. 2 is an illustration of a family of integrated circuit devices that meet different speed parameters. In this example, devices 202 labeled with a −2 are expected to conform to the slow speed parameter of Table 1 and Table 2. Similarly, devices 203 labeled with a −5 are expected to conform to the mid-speed parameter of Table 1 and Table 2 and devices 204 labeled with a −8 are expected to conform to the fast speed parameter of Table 1 and Table 2.

Unfortunately, as mentioned above, occasionally a batch of devices may get mixed up and mislabeled. This may be the result of mixing up the bins from a multi-bin probe station, or mixing up wafers prior to a pick and place station, for example. Rather than scrapping a large number of finished devices, it has now been discovered that the devices may be screened using a simple pattern signature test that may be performed by a low cost, unsophisticated tester that may be included within a station that is handling the packaged and labeled devices to place them on a tape, or other type of final packaging for shipment to a customer, for example.

Figure 3:
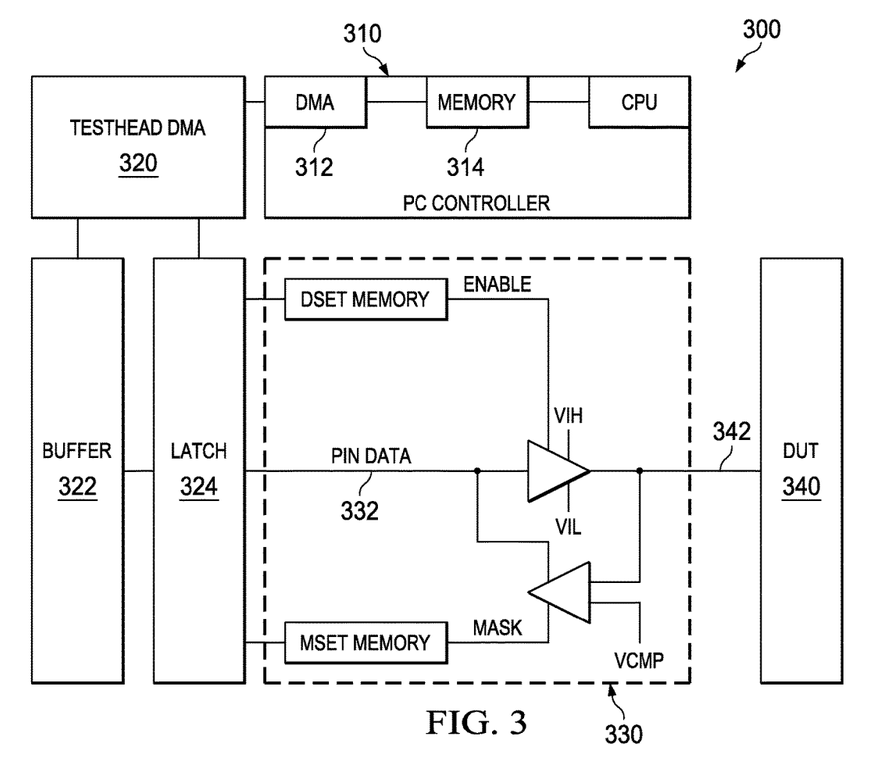
FIG. 3 is a block diagram of a tester that may be used to test packaged integrated circuits.

FIG. 3 is a block diagram of a tester 300 that may be used to test packaged integrated circuits. Controller 310 may be a personal computer type device, or any sort of computer system that may include a processor (CPU) and a memory. The memory may be loaded with a program for execution by the CPU that controls the operation of the tester 300. Controller 310 may also include various peripheral connections for connecting to a user interface (not shown) and/or to a local or wide area network using now known or later developed communication protocols. In this manner, controller 310 may be controlled by a local station operator using the user interface, or may be interconnected with a larger production control system, for example.

The test system may include a direct memory access (DMA) engine 320 that may be coupled to DMA engine 312 within controller 312 to allow sequences of data words to be transferred from the memory of controller 310 to a buffer 322 and thereby to latch 324. The general operation of DMA transfers is well known and need not be described in detail herein. Basically, a starting address and length of transfer may be provided to the DMA engine by a program executing on the CPU of controller 310, which then sequentially transfers the requested sequence of data in a periodic manner from memory 314 to the tester.

The data in latch 324 may then be provided to a device under test 340 using a pin circuit. Pin circuit 330 is representative of multiple pin circuits that allow multiple pins on a DUT to be driven or monitored. In this case, DUT 340 is a simple transceiver, as described above. Data on pin line 332 from a bit in latch 324 may be applied to pin 342 of DUT 340 that provides a test signal to DUT 340. A similar pin circuit may then the connected to an output pin of DUT 340 to monitor a signal that is produced in response to input signal 342. A data set (DSet) control word and a mask set (MSet) control word may be used to control a pin driver or a pin receiver in pin circuit 330, for example.

In this example, the sequence of data that is obtained from memory 314 is buffered and divided into test vectors. Each test vector is loaded into latch 324 in a periodic manner that is determined by the cycle times of DMA engine 320 and 312. Thus, the data that is provided on pin data line 332 corresponds to the same bit of each subsequent test vector that is loaded into latch 324. As will be described below, a configurable parameter may be used to control the rate at which pattern latch 324 is updated.

Figure 4:
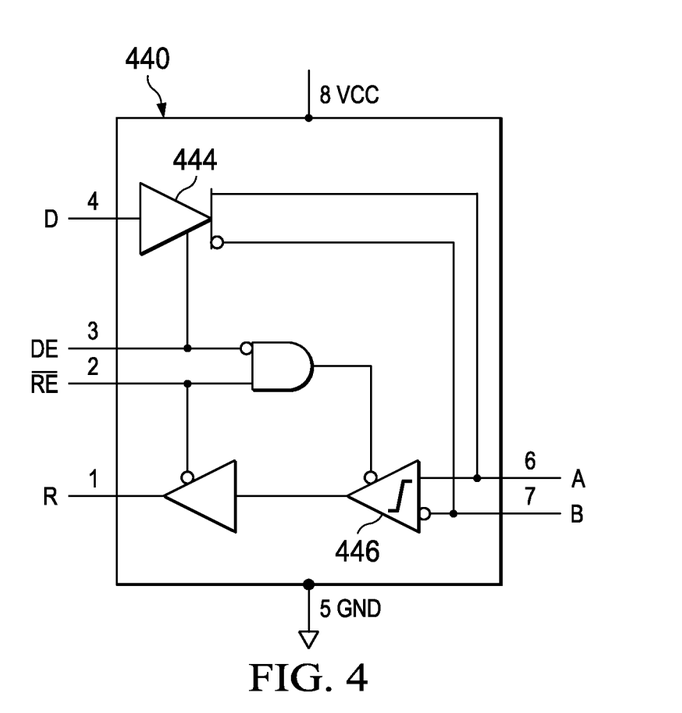
FIG. 4 illustrates a example device that may be screened.

FIG. 4 illustrates an example transceiver device 440 in more detail. As discussed above, transceiver device 440 may be produced to meet different operating speed parameters, as summarized in Table 1 and Table 2. Device 440 includes a differential driver 444 that receives an input signal on pin D and produces a differential output on pins A and B. Receiver 446 receives a differential signal on pins A and B and provides an input signal on pin R. A driver enable signal on pin DE and a receiver enable signal in pin RE/control the operation of transceiver 440.

Figure 5:
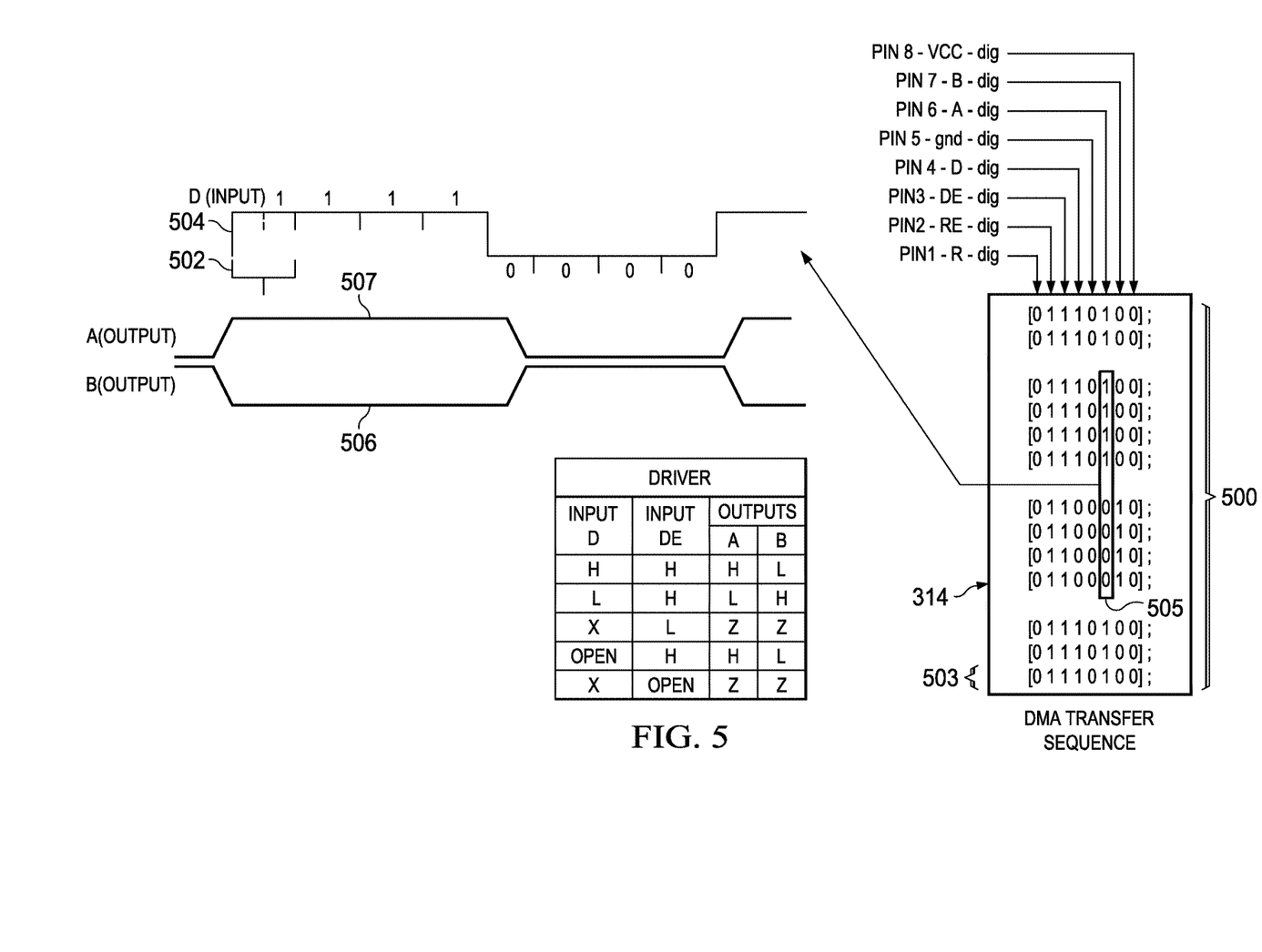
FIG. 5 illustrates a sequence of test vectors that may be used to create the test pattern to screen the device of FIG. 4.

FIG. 5 illustrates an example sequence of test vectors 500 that may be accessed in memory 314 by using DMA engine 320 and 312 to create a stream of test vectors. In this example, the tester operates on a cycle time of 33 ns, which means that every 33 ns corresponds to one event in which data may be obtained from memory 314 and loaded into latch 324. However, the tester may be configured to update pattern latch 324 only after a specified number of events. In this example, the tester is updated every two events. Thus, period 502 represents a tester cycle time of 66 ns, which is 33 ns*number of events, which in this case it is two, for every vector 403.

In this example, the sequence of test vectors 500 may be packed into a data structure in memory 314 in a serial manner and then unpacked by tester buffer 322. In another embodiment, the test vectors may be aligned on a word basis, in which each word location in memory 314 contains a single vector, for example. In other embodiments, the test vectors may be stored on other configurations that are understood by the controller 310 and buffer 322, for example.

A test pattern 504 for signal D (Input) to the device will result in the output of the device A and B as shown by signals 506, 507. For example, in order to get 264 ns of high data on the input D, four vectors are needed since 4*33 ns*2 (events per vector)=264 ns, as indicated at 505. In this manner, any given test pattern may be created for the DUT by created a sequence of test vectors in memory 314.

As illustrated, the sequence of test vectors 500 also includes the data to produce a read enable signal and driver enable signal for DUT 440, along with the expected output signals 506, 507 for output pins A and B. The tester may then monitor the DUT and compare the actual output data from the DUT with the expected output signal specified by the sequence of test vectors.

Figure 6:
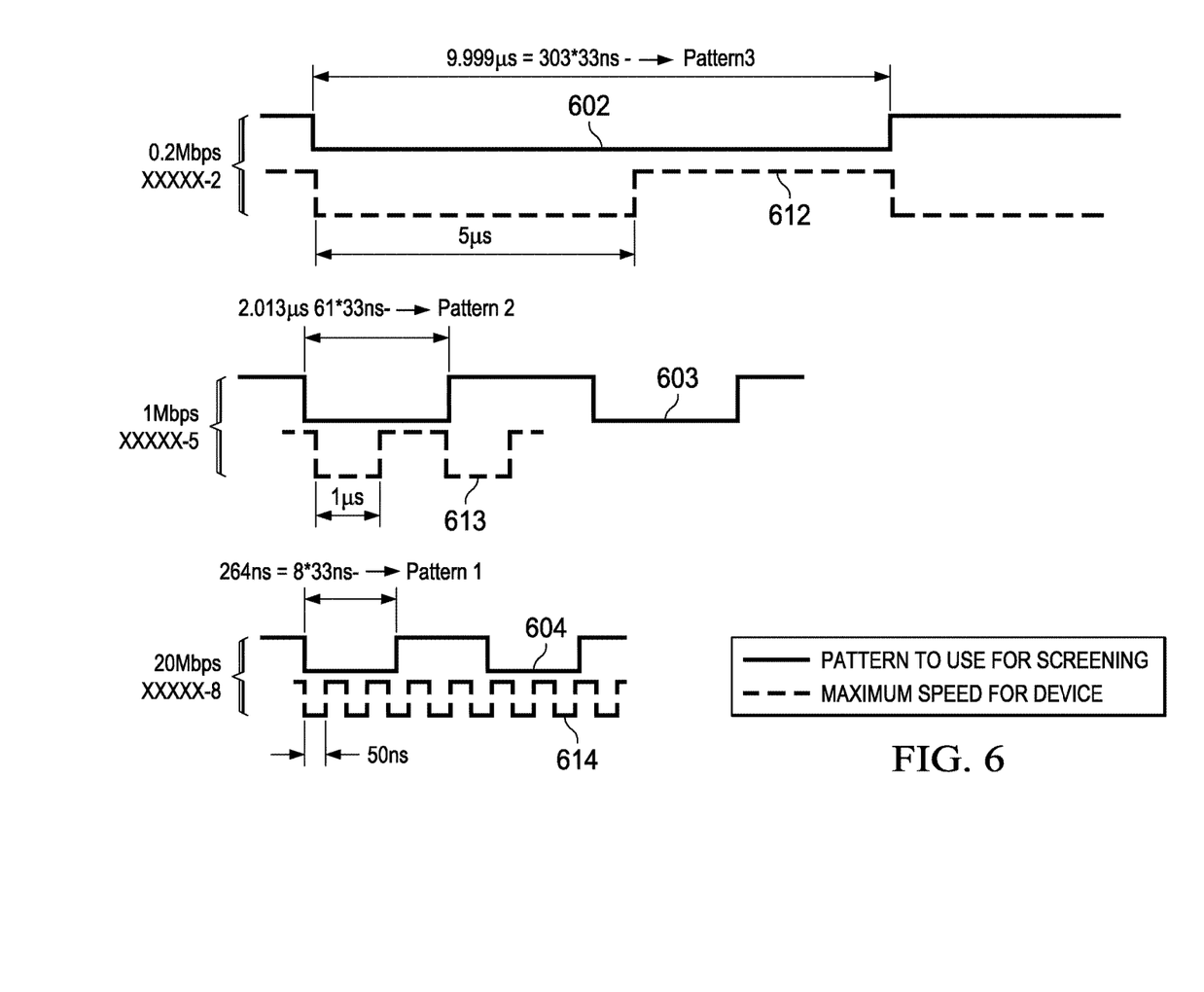
FIG. 6 is a set of waveforms that illustrate simple waveforms that may be used to screen a batch of integrated circuits.

FIG. 6 is a set of waveforms that illustrate simple waveforms that may be used to screen a batch of integrated circuits. In this example, the goal is to screen a batch of devices to determine if a batch of devices labeled as fast parts (XXXX-8) are all actually fast parts, or if a batch of devices labeled as mid parts (XXXX-5) are all actually mid parts, or if a batch of devices labeled as slow parts (XXXX-2) are all actually slow parts.

In this example, the three types of parts may be screened using three patterns with different signaling rates according to device specifications, such as those illustrated in Table 1. Signal 612 represents the maximum speed signal for a slow part, as indicated in Table 1. Similarly, signals 613 and 614 illustrate a maximum speed signal for a mid and a fast part, respectively. In this example, test pattern 602 represents a "slow" pattern, 603 represents a "mid" pattern, and 604 represents a "fast" pattern that may be used to screen the parts.

When the pattern signal is applied to an input D of driver 444 in DUT 440, referring back to FIG. 3 and FIG. 4, a corresponding signal will be formed on output A and B that may be monitored to determine if the driver is able to correctly transmit the test pattern. If the test pattern is correctly transmitted to output A and B, then the test passes, otherwise it fails. In the case of mid speed device 203, referring back to FIG. 2, the patterns are designed so that mid-speed device 203 can pass the slow pattern 602 and the mid pattern 603, but fail the fast pattern 604. Slow device 202 should pass the slow pattern 602 but fail the mid pattern 603 and fast pattern 604. Fast device 204 should pass the slow pattern 602, the mid pattern 603, and the fast pattern 604. Table 3 summarizes the expected test results for the three members of this example device family.

TABLE 3

Expected test results for various speed ICs

|  | Fast IC | Mid IC | Slow IC |
| --- | --- | --- | --- |
| Fast pattern | Pass | Fail | Fail |
| Mid Pattern | Pass | Pass | Fail |
| Slow Pattern | Pass | Pass | Pass |

In this example, slow pattern 602 is designed to be approximately 20 us with a 10 us low portion and a 10 us high portion. The number of vectors needed to achieve this depends on the number of events that is needed. Recall that in this example, the DMA cycle time of tester 300 is 33 ns. Thus, 33*X=10 us, X=303 event cycles. By configuring the tester to update pattern latch 324 only every six events, each test vector takes 198 ns (33 ns*6 events/vector). Therefore, 50 vectors may be used to produce a 9.9 us low portion of a test signal, and an additional 50 vectors may be used to produce a 9.9 us high portion of the test signal. To test the DUT with the slow pattern, the DMA is configured to repeatedly access a data structure in memory 314 that contains these 100 vectors, for example.

Similarly, mid pattern 603 is designed to be approximately 4 us with a 2 us low portion and a 2 us high portion. Each portion of pattern 603 may therefore be produced by 61 vectors at 33 ns/vector, for example. Fast pattern 604 is designed to be approximately 0.5 us with a 264 ns low portion and a 264 ns high portion. Each portion of pattern 604 may therefore be produced by four vectors at 66 ns/vector (two events/vector), for example. As can be seen, for each test pattern, the number of events per vector may be selected to determine the over size of a data structure to produce the sequence of test vectors.

A simple compiler may be used to create the test patterns. A data construct may define the length of each low portion and the length of each high portion of the test pattern. The compiler may then create a data structure that includes a sequence of test vectors as illustrated in FIG. 5 to create the required bit pattern in a selected bit position. The total length of the data structure is then determined by the compiler and an appropriate command block for DMA engines 320, 312 is produced by the compiler so that test controller 300 can access the test patterns after they are loaded into memory 314. In this example, an input pattern for the data input pin D and the enable signals for pins DE and RE are contained in each test vector sequence, along with the expected output signals. For a more complex DUT, there may be additional input patterns, such as data and a clock, for example . . . .

Figure 7A:
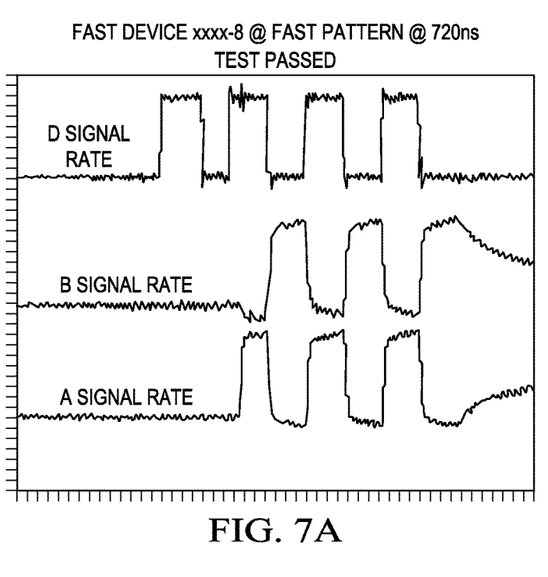
FIGS. 7A, 7B illustrate the results of testing two different speed devices.
Figure 7B:
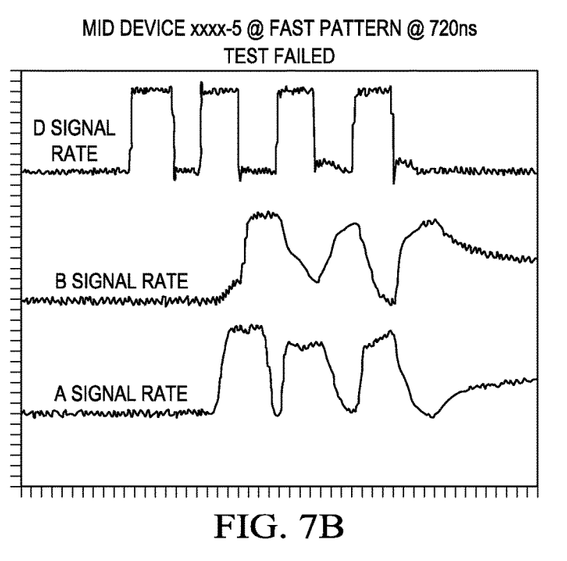

FIG. 7A illustrates the results of testing fast device 204 with fast pattern 604. As discussed above, the test pattern is applied to the D input pin of DUT 340, and output pins A and B are monitored. As can be seen, device 204 passes the fast pattern 604. FIG. 7B illustrates the results of testing mid device 203 with fast pattern 604. As discussed above, the test pattern is applied to the D input pin of DUT 340, and output pins A and B are monitored. As can be seen, device 203 fails the fast pattern 604. Similar pass or fail results may be obtained when testing other combinations of device speed and pattern speed, as summarized in Table 3. Pass/fail is determined according a truth table for the device such as table 700 in FIG. 7A.

Figure 8:
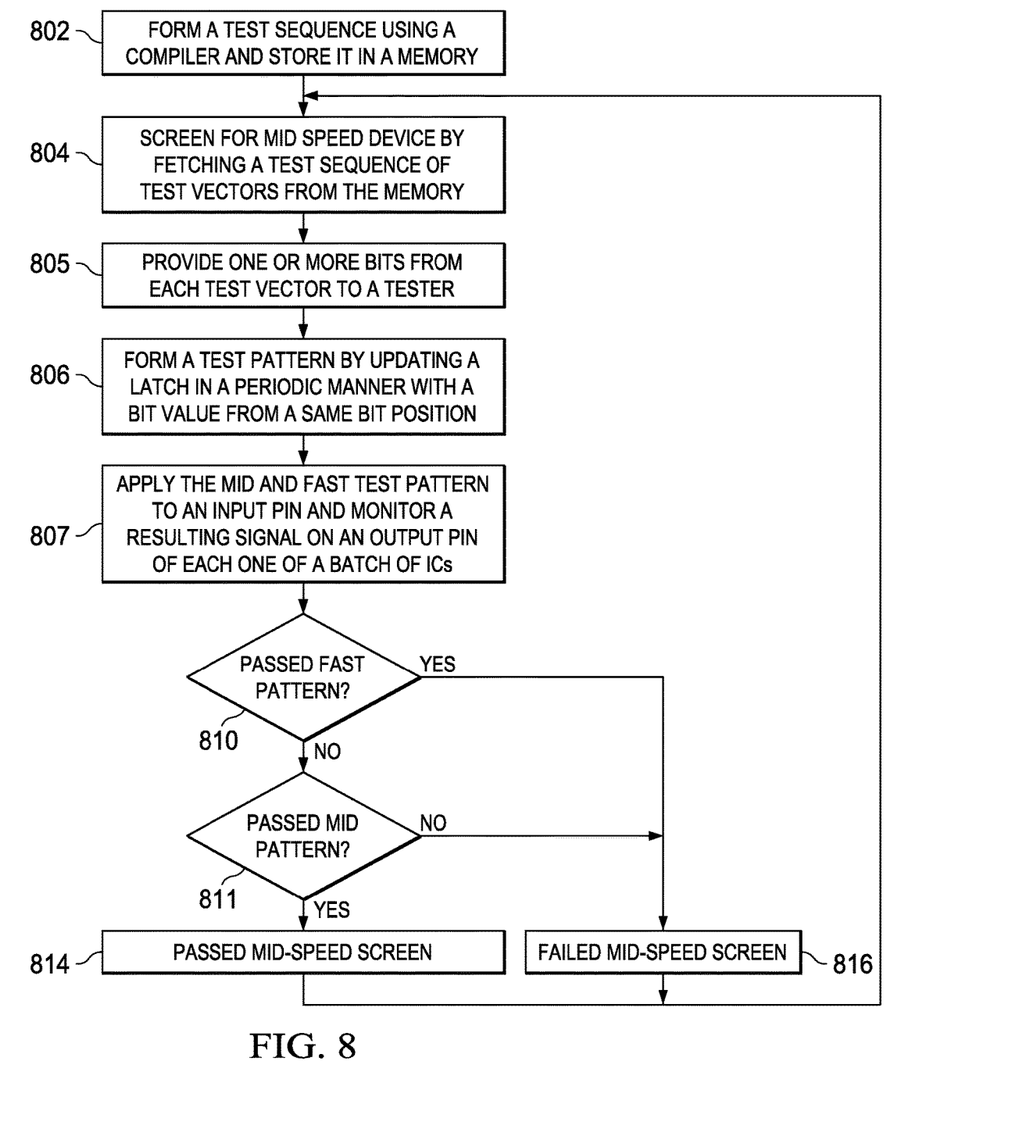
FIGS. 8-10 are flow diagrams illustrating screening of devices using the patterns illustrated in FIG. 6.

FIG. 8 is a flow diagram illustrating screening mid-speed devices using the patterns illustrated in FIG. 6 according to Table 3. Initially, a set of patterns is designed 802 that may be used to quickly screen a device to determine if it is correctly labeled. This may be done by using a compiler to create a sequence of test vectors that may then be loaded in a memory that is coupled to a tester, as described above with regard to FIGS. 5-6.

After loading a batch of devices in the tester and selecting which family member is to be screened, one or more test sequences of test vectors may be fetched 804 from the memory using a DMA engine, as described in more detail above. For each test pattern signal, one bit from each data word is provided 805 to the tester. A test pattern signal is formed 806 by updating a latch in a periodic manner with a bit value from a same bit position from each of the sequence of data words. The test pattern is applied 807 to an input pin of a DUT and a resulting signal is monitored on an output pin of each one of the batch of ICs.

This manner of forming a simple test pattern by using a periodic update event is different from a typical ATE (assembly and test equipment) test system that uses vectors that specify exact start times period durations. ATE test systems require much more complicated electronics to accurately control test signal transition times which are not required in this case.

In this example, since a mid-speed device is being screened, if the device passes 810 a fast pattern test, then it is marked as a failure 816 because a mid-speed part is not expected to pass a fast pattern test. In this case, it may be a fast device that is mis-labeled. Similarly, it the device fails the fast pattern 810 and also fails the mid pattern 811, then it is marked as a failure 816. In this case, it may be a slow speed device that is mis-labeled. Each device that fails the fast pattern 810 and passes the mid pattern 811 passes the screen test 814 and is considered to be a correctly labeled mid-speed device.

Figure 9:
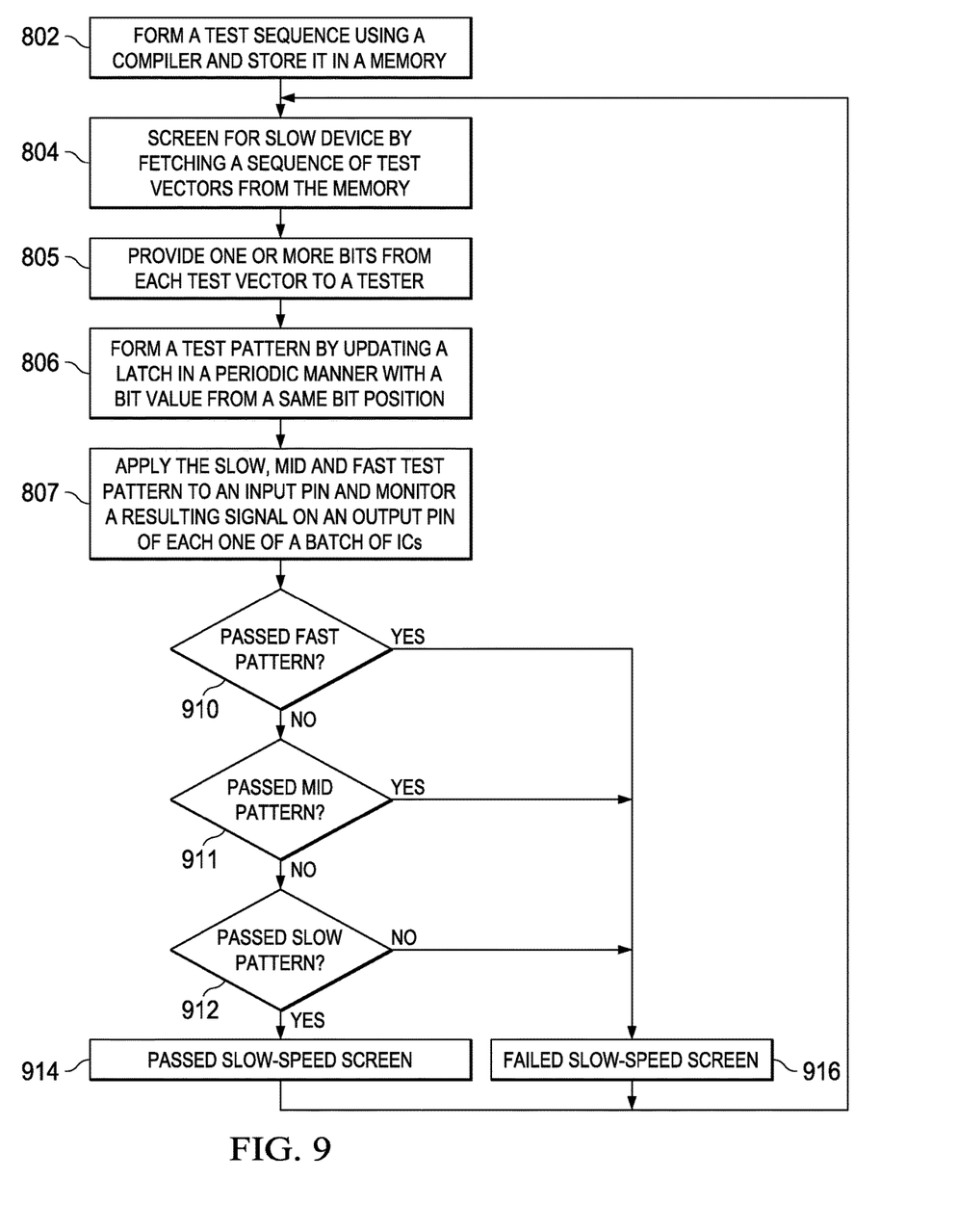

FIG. 9 is a flow diagram illustrating screening slow-speed devices using the patterns illustrated in FIG. 6 according to Table 3. The same patterns are created 802 and used 804-807 as described with regard to FIG. 8. In this example, since a slow-speed device is being screened, if the device passes 910 a fast pattern test, then it is marked as a failure 916 because a slow-speed part is not expected to pass a fast pattern test. In this case, it may be a fast device that is mis-labeled. Similarly, it the device fails the fast pattern 910 but passes the mid pattern 911, then it is marked as a failure. In this case, it may be a mid speed device that is mis-labeled. Each device that fails the fast pattern 910, fails the mid pattern 911, and passes the slow pattern 912 passes the screen test 914 and is considered to be a correctly labeled slow-speed device.

Figure 10:
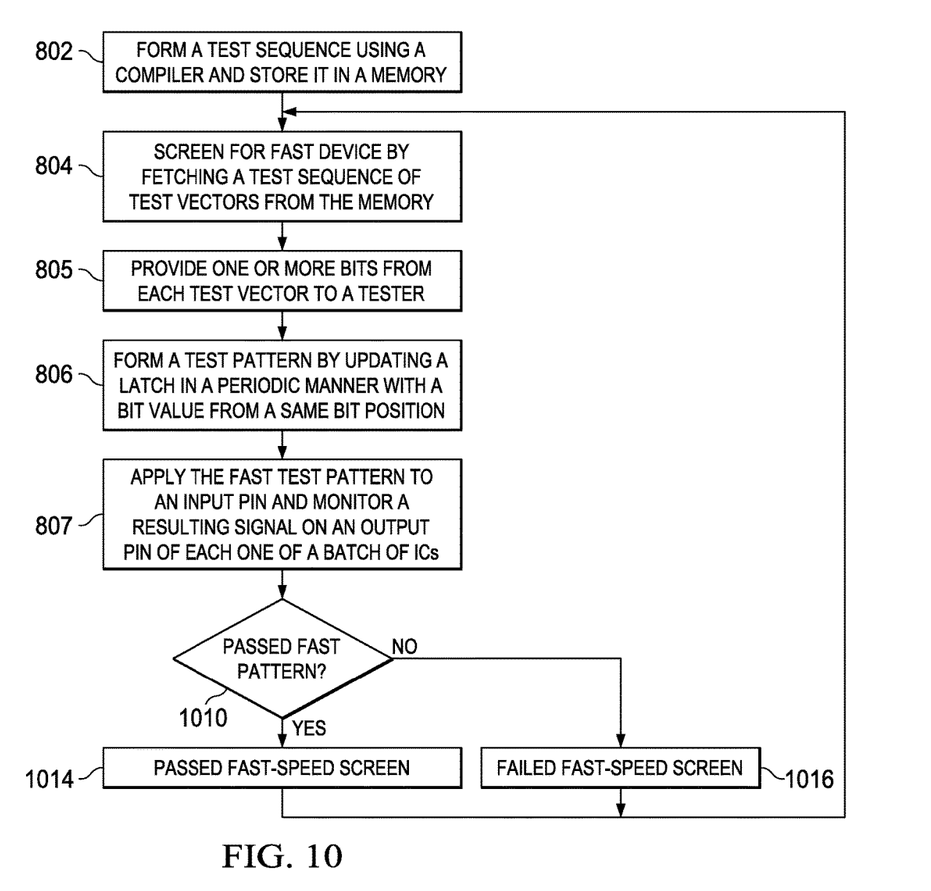

FIG. 10 is a flow diagram illustrating screening fast-speed devices using the patterns illustrated in FIG. 6 according to Table 3. The same patterns are created 802 and used 804-807 as described with regard to FIG. 8. In this example, since a fast device is being screened, if the device fails 1010 a fast pattern test, then it is marked as a failure 1016. In this case, it may be a slow or mid speed device that is mis-labeled. Each passes the fast pattern 1010 passes the screen test 1014 and is considered to be a correctly labeled fast device.

In this manner, a simple tester may perform screening operations during a transfer step in an assembly process, such as for loading devices into a shipping package. The screening test is simple and may be performed in less than 50 ms. The example tester described herein can perform the simple signaling rate test in only 2.5 ms. This same tester may take over 100 ms for a propagation delay test, so in this example the signaling rate test is used.

Other Embodiments

While the invention has been described with reference to illustrative embodiments, this description is not intended to be construed in a limiting sense. Various other embodiments of the invention will be apparent to persons skilled in the art upon reference to this description. For example, while a simple transceiver family of devices was described herein, other families of devices may be more complicated and require test patterns to form clock signals, enable signals, etc., for example.

While a family of devices having three speed categories was described herein, (fast, mid, and slow) other embodiments may use fewer or additional speed categories.

While a sixteen bit memory structure to hold the test pattern vectors was described herein, other embodiments may be organized with larger or smaller bit counts.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a non-transitory computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the preceding discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method, comprising:
   generating a test pattern based on a bit position from a sequence of test vectors;
   generating a speed test signal based on the test pattern, the speed test signal having a period based on a number associated with a speed characteristic;
   determining the speed characteristic of a device in an integrated circuit (IC) die by applying the speed test signal to the device; and
   encapsulating the IC die with a package indicating the speed characteristic of the device wherein:
   the speed characteristic includes a first operation speed and a second operation speed slower than the first operation speed;
   the speed test signal includes a first speed test signal and a second speed test signal slower than the first speed test signal;
   the device in the IC die includes: a first device in a first IC die on a wafer, and a second device in a second IC die on the wafer; and
   the determining the speed characteristic of the device includes:
   determining the first device, before the first IC die is singulated from the wafer, having the first operation speed if the first device passes a first speed test based on the first speed test signal; and
   determining the second device, before the second IC die is singulated from the wafer, having the second operation speed if the second device passes a second speed test based on the second speed test signal and fails the first speed test based on the first speed test signal.

2. The method of claim 1, wherein the generating the test pattern excludes specifying a start time period duration from the sequence of test vectors.

3. The method of claim 1, wherein:
   the speed characteristic includes a first operation speed and a second operation speed slower than the first operation speed;
   the speed test signal includes:
   a first speed test signal having a first period based on a first number associated with the first operation speed;
   a second speed test signal having a second period and based on a second number associated with the second operation speed;
   the first period shorter than the second period; and
   the first number less than the second number.

4. The method of claim 1, wherein:
   the speed characteristic includes a first operation speed and a second operation speed slower than the first operation speed;
   the speed test signal includes a first speed test signal and a second speed test signal slower than the first speed test signal; and
   the determining the speed characteristic of the device includes:

determining the device having the first operation speed if the device passes a first speed test based on the first speed test signal; and determining the device having the second operation speed if the device passes a second speed test based on the second speed test signal and fails the first speed test based on the first speed test signal.

5. The method of claim 1, wherein the generating the speed test signal includes updating a latch with the test pattern and according to a period based on a multiplication of the number and a vector fetching cycle time.

6. The method of claim 3, wherein:
the speed characteristic includes a third operation speed slower than the second operation speed;
the speed test signal includes:
　a third speed test signal having a third period and based on a third number associated with the third operation speed;
　the third period longer than the second period; and
　the third number greater than the second number.

7. The method of claim 4, wherein:
the speed characteristic includes a third operation speed slower than the second operation speed;
the speed test signal includes a third speed test signal slower than the second speed test signal; and
the determining the speed characteristic of the device includes:
　determining the device having the third operation speed if the device passes a third speed test based on the third speed test signal and fails the first speed test based on the first speed test signal and the second speed test based on the second speed test signal.

8. The method of claim 1, wherein:
the speed characteristic includes a third operation speed slower than the second operation speed;
the speed test signal includes a third speed test signal slower than the second speed test signal; and
the device in the IC die includes a third device in a third IC die on the wafer; and
the determining the speed characteristic of the device includes:
　determining the third device, before the third IC die is singulated from the wafer, having the third operation speed if the third device passes a third speed test based on the third speed test signal and fails the first speed test based on the first speed test signal and the second speed test based on the second speed test signal.

\* \* \* \* \*